US010891993B2

(12) United States Patent
Shakeri et al.

(10) Patent No.: US 10,891,993 B2
(45) Date of Patent: Jan. 12, 2021

(54) WAVE PIPELINE

(71) Applicant: MICRON TECHNOLOGY, INC., Boise, ID (US)

(72) Inventors: Kaveh Shakeri, Saratoga, CA (US); Ali Feiz Zarrin Ghalam, Sunnyvale, CA (US); Qiang Tang, Cupertino, CA (US); Eric N. Lee, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/429,209

(22) Filed: Jun. 3, 2019

(65) Prior Publication Data

US 2019/0295614 A1    Sep. 26, 2019

Related U.S. Application Data

(62) Division of application No. 15/834,279, filed on Dec. 7, 2017, now Pat. No. 10,360,956.

(51) Int. Cl.
*G11C 7/10* (2006.01)
*G11C 7/22* (2006.01)
(Continued)

(52) U.S. Cl.
CPC ............. *G11C 7/222* (2013.01); *G11C 7/06* (2013.01); *G11C 7/106* (2013.01); *G11C 7/1006* (2013.01);
(Continued)

(58) Field of Classification Search
CPC ..... G11C 7/222; G11C 7/1006; G11C 7/1039; G11C 7/06; G11C 8/06; G11C 8/04;
(Continued)

(56) References Cited

U.S. PATENT DOCUMENTS 6,005,412 A    12/1999    Ranjan et al.
6,469,652 B1    10/2002    Aude
(Continued)

FOREIGN PATENT DOCUMENTS

WO    2002/071407 A2    9/2002
WO    2008/076790 A2    6/2008

OTHER PUBLICATIONS

International Search Report and Written Opinion of the International Searching Authority for Application No. PCT/US2018/059540 dated Feb. 20, 2019 (19 pages).

*Primary Examiner* — Tha-O H Bui
(74) *Attorney, Agent, or Firm* — Dicke, Billig & Czaja, PLLC

(57) ABSTRACT

A wave pipeline includes a first stage, a plurality of second stages, and a third stage. The first stage receives a data signal representative of data and a clock signal, and may process the data at a first data rate equal to a clock rate of the clock signal. Each second stage may process respective data in response to a respective clock cycle received from the first stage at a second data rate equal to the first data rate times the number of second stages. The third stage may process data received from each second stage at the first data rate. The first stage divides the data signal and the clock signal between the plurality of second stages. The third stage merges the respective data and the respective clock cycles from each of the plurality of second stages to provide a merged data signal and a return clock signal.

21 Claims, 12 Drawing Sheets

(51) Int. Cl.
  *G11C 7/06*   (2006.01)
  *G11C 8/06*   (2006.01)
  *G11C 8/04*   (2006.01)
  *G11C 8/18*   (2006.01)
  *G11C 16/04*  (2006.01)

(52) U.S. Cl.
  CPC .......... *G11C 7/1039* (2013.01); *G11C 7/1057* (2013.01); *G11C 8/04* (2013.01); *G11C 8/06* (2013.01); *G11C 8/18* (2013.01); *G11C 16/0483* (2013.01)

(58) Field of Classification Search
  CPC ......... G11C 7/106; G11C 7/1057; G11C 8/18; G11C 16/0483
  USPC .................................................. 365/189.02
  See application file for complete search history.

(56) References Cited

U.S. PATENT DOCUMENTS

| | | | |
|---|---|---|---|
| 6,757,212 B2 * | 6/2004 | Hamamoto | G11C 7/1051 |
| | | | 365/189.05 |
| 6,952,115 B1 | 10/2005 | Andrews et al. | |
| 9,331,701 B1 | 5/2016 | Zhang et al. | |
| 9,460,803 B1 * | 10/2016 | Tang | G11C 7/1057 |
| 2006/0198234 A1 | 9/2006 | Thomann et al. | |
| 2010/0232237 A1 | 9/2010 | Demone | |
| 2014/0089575 A1 | 3/2014 | Mes | |
| 2014/0215294 A1 | 7/2014 | Kim et al. | |

\* cited by examiner

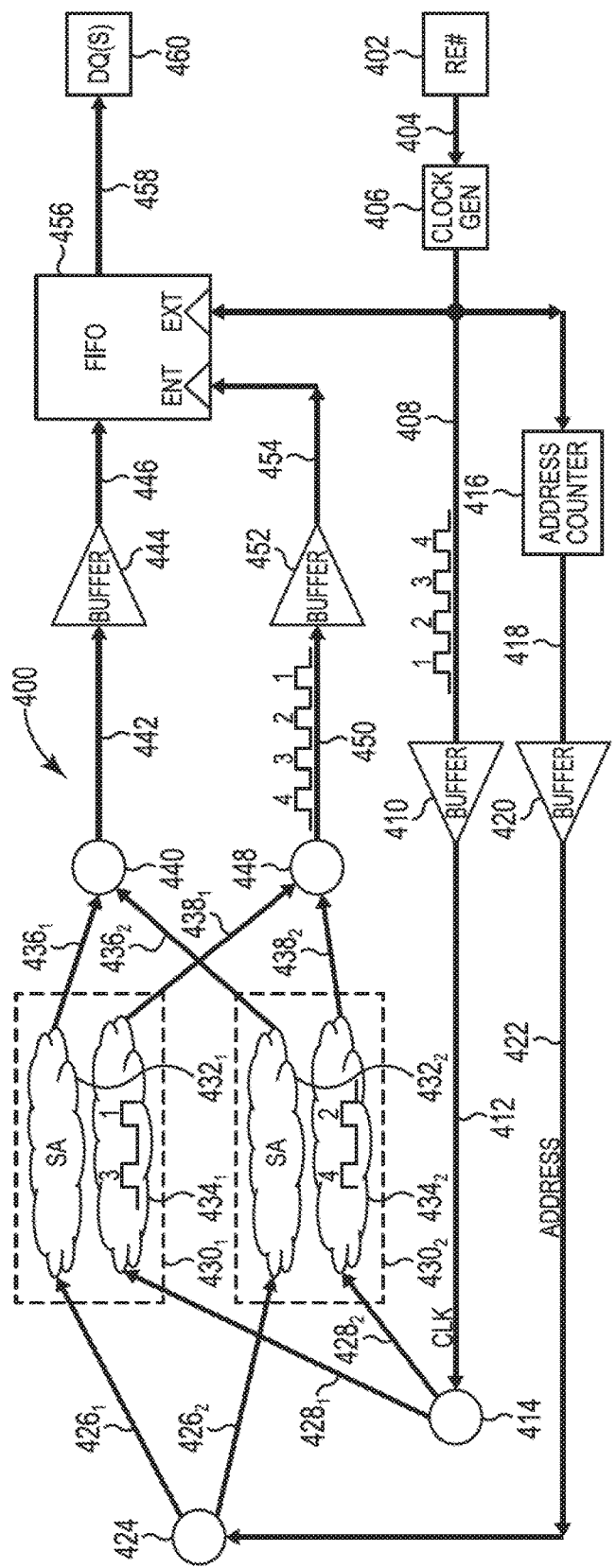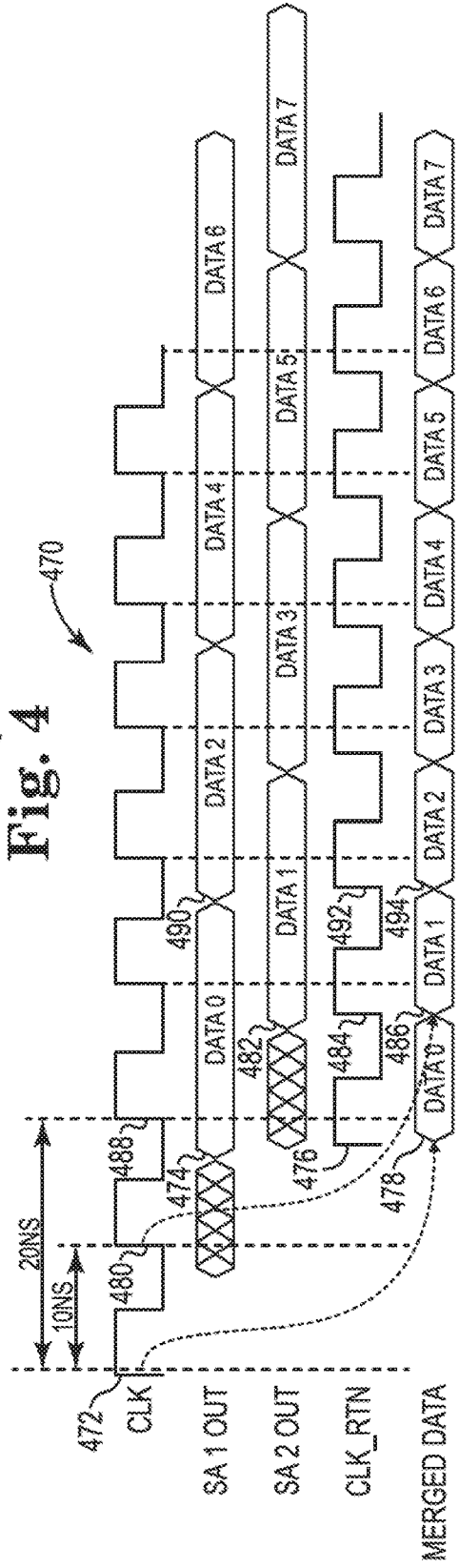

WAVE PIPELINE

RELATED APPLICATIONS

This Application is a Divisional of U.S. application Ser. No. 15/834,279, titled "WAVE PIPLINE," filed Dec. 7, 2017, issued as U S. Pat. No. 10,360,956 on Jul. 23, 2019, which is commonly assigned and incorporated herein by reference.

TECHNICAL FIELD

The present disclosure relates generally to signal timing in integrated circuit devices. In particular, in one or more embodiments, the present disclosure relates to a wave pipeline data path including an N-way stage in a memory device, where N is at least two.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

A wave pipeline may be used in a data path to send or receive data between different parts of an integrated circuit, such as a memory device. For correct operation of a wave pipeline, two conditions typically must be met. First, in each stage of the wave pipeline the data and the clock signal should be delayed by the same amount of time. Second, each stage should be ready for the next coming clock cycle of the clock signal. This second condition limits the data rate of each stage by generally requiring the data rate to be equal to or faster than the clock rate. Thus, the second condition limits the time available for each stage to complete a full operation and be ready for the next input to a single clock cycle.

For the reasons stated above, and for other reasons stated below which will become apparent to those skilled in the art upon reading and understanding the present specification, there is a need in the art for alternative methods for processing data through a wave pipeline, and system and apparatus to perform such methods.

BRIEF DESCRIPTION OF THE DRAWINGS

FIG. 4 is a schematic diagram illustrating one embodiment of an output data path.

FIG. 5 is a timing diagram illustrating one embodiment of the data and clock signals of the output data path described with reference to FIG. 4.

DETAILED DESCRIPTION

Figure 1:
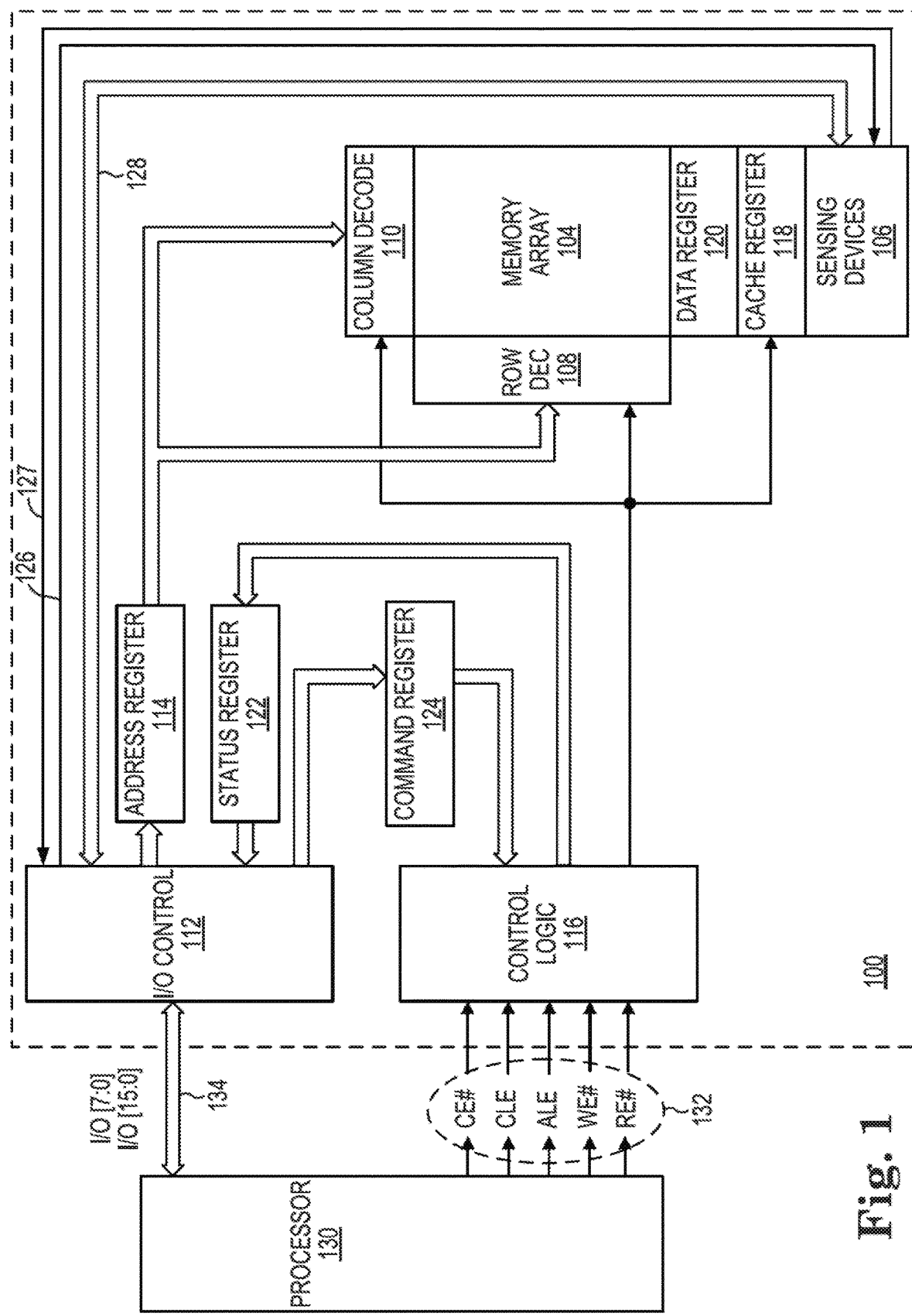
FIG. 1 is a simplified block diagram of one embodiment of a memory device in communication with a processor as part of an electronic system.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

To satisfy the two conditions for the correct operation of a wave pipeline (i.e., in each stage of the wave pipeline the data and the clock signal should be delayed by the same amount of time and each stage should be ready for the next coming clock cycle of the clock signal), the clock rate may need to be reduced to satisfy the slowest stage in the wave pipeline. When the clock rate is reduced, a wider data bus may be used to satisfy data rate requirements. For example, to satisfy data rate requirements for a data path including a stage using 14 ns to process data through the stage, a 128 bit bus running at a 20 ns clock rate may be used instead of a 64 bit bus running at a 10 ns clock rate. Accordingly, this disclosure describes embodiments for accommodating slower stages within a wave pipeline of a data path without reducing the clock rate and thus not increasing the width of the data bus to satisfy the data rate requirements.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. The processor 130, e.g., a controller external to the memory device 100, may be a memory controller or other external host device.

Memory device 100 includes clock-data tracking that may facilitate an improved setup and hold time margin when reading data out of memory device 100. A clock signal path 126 may be routed along with a data bus 128. A return clock signal path 127 also may be routed along with the data bus 128. A clock signal on the clock signal path 126 may be used to trigger data out of the sensing devices 106 (e.g., sense amplifiers). A return clock signal on the return clock signal path 127 may be used to latch the data from the sensing devices 106 into a data latch (e.g., FIFO) of input/output (I/O) control circuitry 112 just prior to outputting the data to processor 130. By routing the clock signal and return clock signal along with the data, they may be subjected to the same logic circuitry and process, voltage, and temperature (PVT) variations as the data, and the setup and hold time margin at the data latch may be improved. It will be recognized that process variations typically experienced in fabrication will generally lead to variations in performance of circuits, even where those circuits are intended to be of the same design or otherwise provide the same functionality. Similarly, even small separations of circuits may expose those circuits to differing voltage and temperature values if measured to sufficient precision. Thus, while this disclosure seeks to mitigate the effects of such variations between clock signal paths and data paths, there is no expectation that such variations are necessarily eliminated.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes I/O control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from sensing devices 106 to the cache register 118. The data is then passed from the cache register 118 to data register 120 for transfer to the array of memory cells 104; then new data is latched in the cache register 118 from sensing devices 106, which receive the new data from the I/O control circuitry 112. During a read operation, data is passed from the cache register 118 to sensing devices 106, which pass the data to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, a write enable WE#, and a read enable RE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118 through sensing devices 106. The data are subsequently written into data register 120 for programming the array of memory cells 104. For another embodiment, cache register 118 may be omitted, and the data are written directly into data register 120 through sensing devices 106. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
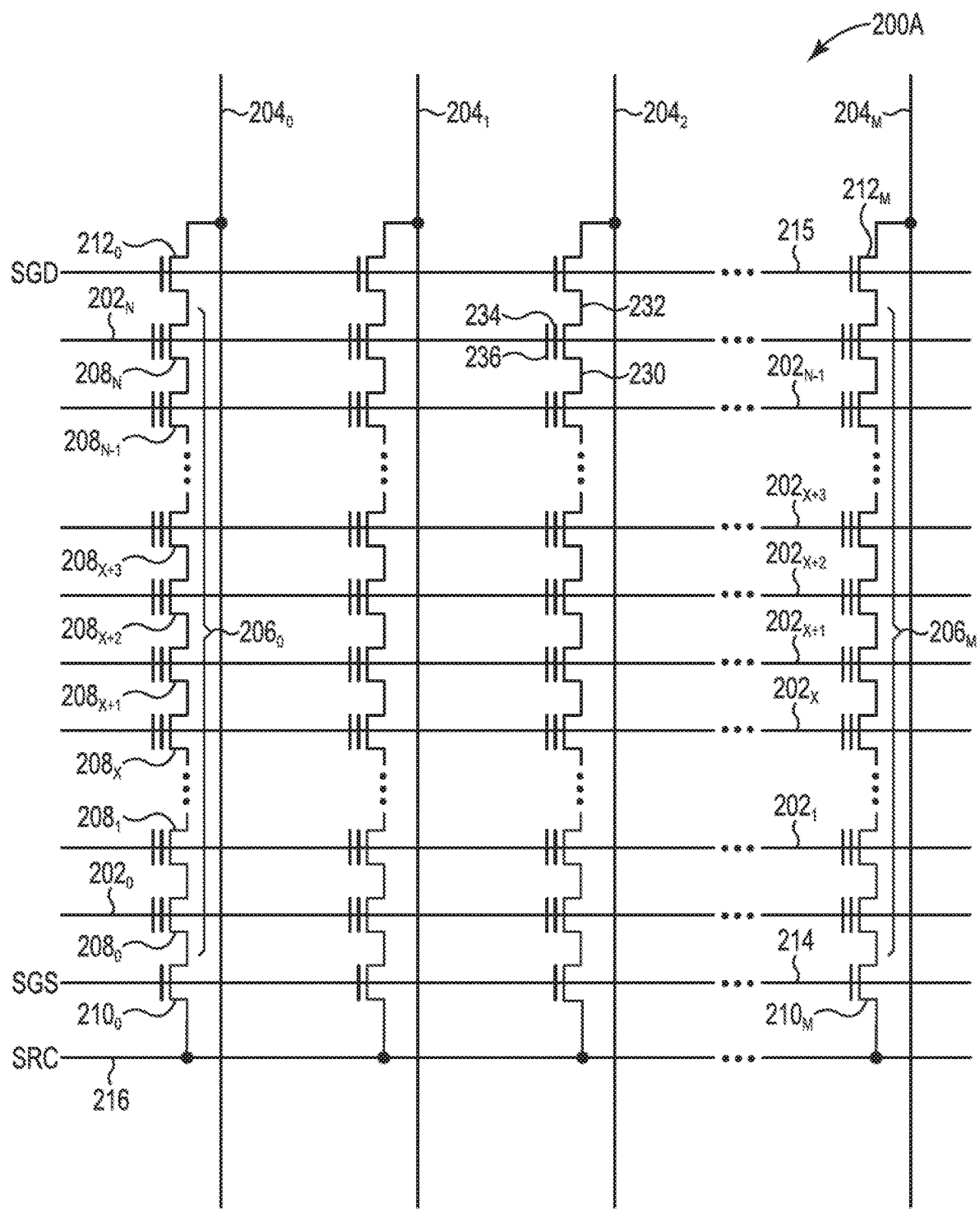
FIGS. 2A-2B are schematic diagrams of portions of an array of memory cells as could be used in a memory device of the type described with reference to FIG. 1.

FIG. 2A is a schematic of a NAND memory array 200A, e.g., as a portion of array of memory cells 104. Memory array 200A includes access lines, such as word lines $202_0$ to $202_N$, and data lines, such as bit lines $204_0$ to $204_M$. The word lines 202 may be coupled to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 2A might be a quasi-two-dimensional memory array and might have a generally planar structure, e.g., where the common source 216, strings 206 and bit lines 204 extend in substantially parallel planes. Alternatively, the memory array in FIG. 2A might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 2A. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2A, it is apparent from the figure that the bit lines 204 of the array of memory cells 200A may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Figure 2B:
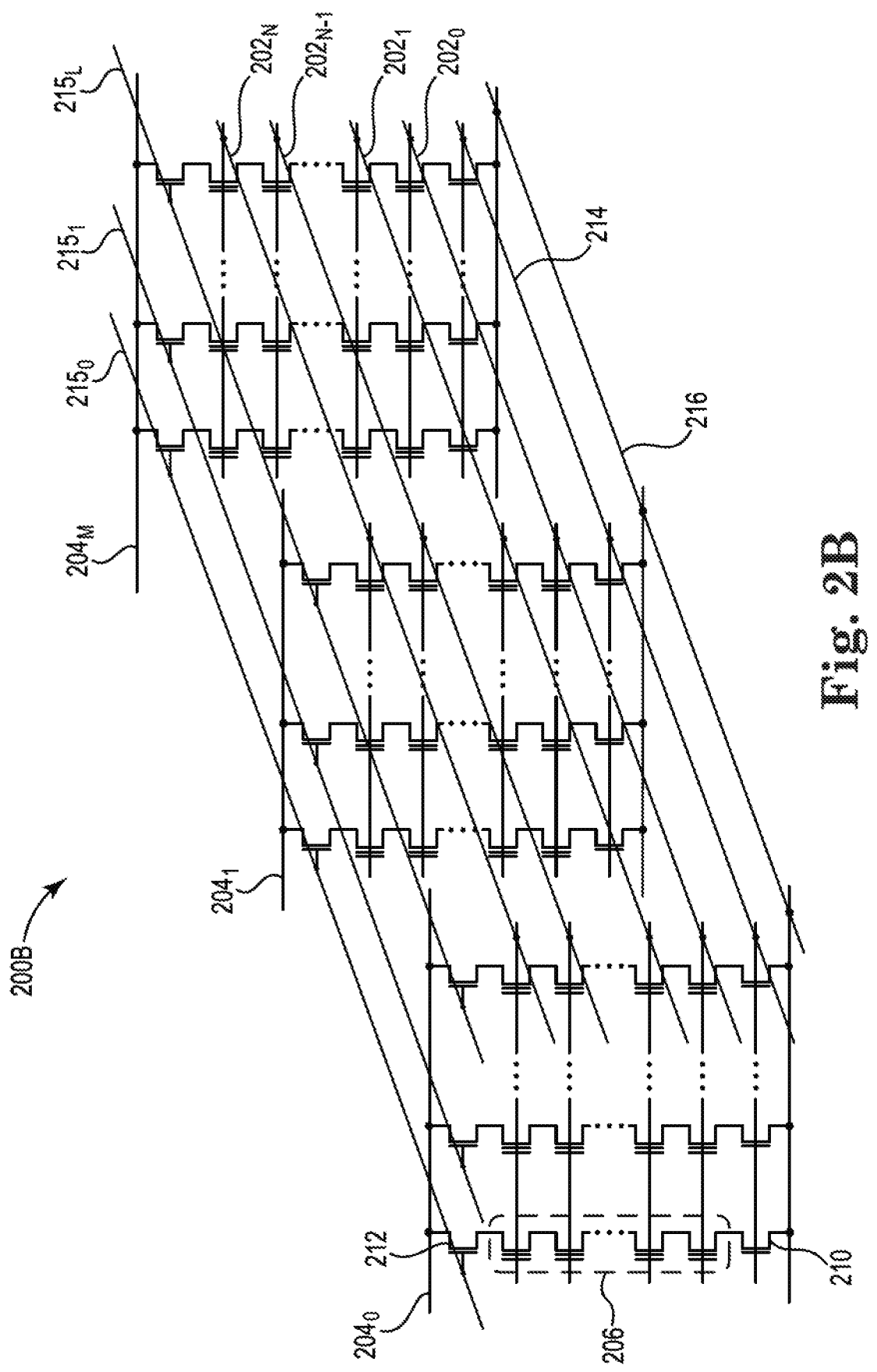

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Although the examples of FIGS. 2A-2B are discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

Figure 3:
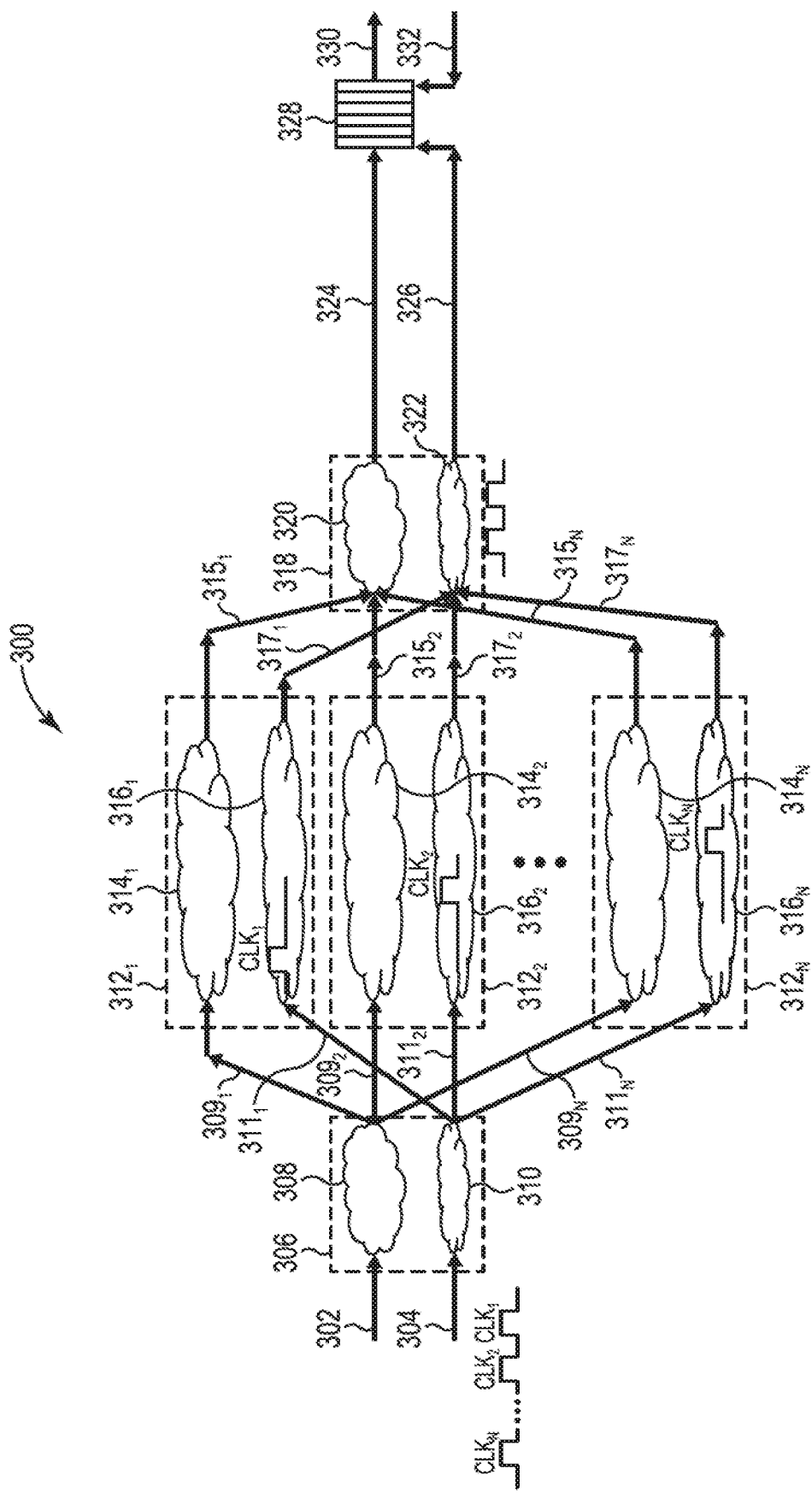
FIG. 3 is a schematic diagram illustrating one embodiment of a wave pipeline.

FIG. 3 is a schematic diagram illustrating one embodiment of a wave pipeline 300. In one example, wave pipeline 300 is a portion of the memory device 100 previously described and illustrated with reference to FIG. 1. Wave pipeline 300 includes a first stage 306, a plurality (i.e., group) of second stages $312_1$ to $312_N$ where "N" is any suitable number of second stages, a third stage 318, and a data latch 328 (e.g., a first in first out (FIFO) circuit). First stage 306 includes a data path 308 and a corresponding clock path 310. Each second stage $312_1$ to $312_N$ includes a data path $314_1$ to $314_N$ and a corresponding clock path $316_1$ to $316_N$, respectively. Third stage 318 includes a data path 320 and a corresponding clock path 322.

The input of data path 308 of first stage 306 is communicatively coupled to a data signal node 302. Communicatively coupled components may be coupled by a single bit signal path or a multiple bit parallel signal path. The input of clock path 310 of first stage 306 is electrically coupled to a clock signal node 304. The output of data path 308 of first stage 306 is communicatively coupled to an input of data path $314_1$ to $314_N$ of second stage $312_1$ to $312_N$ through a data signal path $309_1$ to $309_N$, respectively. The output of clock path 310 of first stage 306 is electrically coupled to an input of clock path $316_1$ to $316_N$ of second stage $312_1$ to $312_N$ through a clock signal path $311_1$ to $311_N$, respectively. The output of data path $314_1$ to $314_N$ of second stage $312_1$ to $312_N$ is communicatively coupled to the input of data path 320 of third stage 318 through a data signal path $315_1$ to $315_N$, respectively. The output of clock path $316_1$ to $316_N$ of second stage $312_1$ to $312_N$ is electrically coupled to the input of clock path 322 of third stage 318 through a clock signal path $317_1$ to $317_N$, respectively. The output of data path 320 of third stage 318 is communicatively coupled to the data input of data latch 328 through a data signal path 324. The output of clock path 322 of third stage 318 is electrically coupled to the entrance clock input of data latch 328 through a return clock signal path 326. The data output of data latch 328 is electrically coupled to an output data node 330. The exit clock input of data latch 328 is electrically coupled to a clock signal node 332. In other examples, wave pipeline 300 may include additional stages prior to first stage 306 and/or between third stage 318 and data latch 328.

First stage 306 receives a data signal from data signal node 302 aligned with a clock signal on clock signal node 304. With the signals aligned, the data is expected to be valid at a corresponding transition of the corresponding clock cycle of the clock signal. First stage 306 may process data in response to the clock signal at a first data rate equal to the clock rate of the clock signal. The delay of data through data path 308 may be substantially equal to (e.g., equal to) the delay of the clock signal through clock path 310 of first stage 306. First stage 306 divides the data signal and the clock signal between the plurality of second stages $312_1$ to $312_N$. First stage 306 passes data aligned with a first clock cycle ($CLK_1$) to second stage $312_1$ through data signal path $309_1$ and passes the first clock cycle to second stage $312_1$ through clock signal path $311_1$. First stage 306 passes data aligned with a second clock cycle ($CLK_2$) to second stage $312_2$ through data signal path $309_2$ and passes the second clock cycle to second stage $312_2$ through clock signal path $311_2$. Likewise, first stage 306 passes data aligned with an Nth clock cycle ($CLK_N$) to second stage $312_N$ through data signal path $309_N$ and passes the Nth clock cycle to second stage $312_N$ through clock signal path $311_N$. Once the Nth clock cycle is reached, first stage 306 passes the N+1 clock cycle and the data aligned with the N+1 clock cycle to second stage $312_1$ and the process repeats.

The second stages $312_1$ to $312_N$ may be substantially identical in that each second stage may process data by performing the same operations. Each second stage $312_1$ to $312_N$ may process data received from first stage 306 at a second data rate equal to or less than the clock rate times the number of second stages $312_1$ to $312_N$. For example, for a clock rate of 10 ns and where N is equal to three, each second stage $312_1$ to $312_N$ may process data within a 30 ns data rate (i.e., 30 ns per unit of data processed). This 30 ns data rate may be a maximum value and each second stage $312_1$ to $312_N$ may process the data faster than at a 30 ns data rate. In any case, each second stage $312_1$ to $312_N$ may use more than one clock cycle of the clock signal and up to N clock cycles of the clock signal to process data. The delay of data through each data path $314_1$ to $314_N$ may be substantially equal to (e.g., equal to) the delay of each clock signal through each clock path $316_1$ to $316_N$ of each second stage $312_1$ to $312_N$, respectively.

After processing of the data in second stage $312_1$ is complete, second stage $312_1$ passes the processed data aligned with the first clock cycle to third stage 318 through data signal path $315_1$ and passes the first clock cycle to third stage 318 through clock signal path $317_1$. After processing of the data in second stage $312_2$ is complete, second stage $312_2$ passes the processed data aligned with the second clock cycle to third stage 318 through data signal path $315_2$ and passes the second clock cycle to third stage 318 through clock signal path $317_2$. Likewise, after processing of the data in second stage $312_N$ is complete, second stage $312_N$ passes the processed data aligned with the Nth clock cycle to third stage 318 through data signal path $315_N$ and passes the Nth clock cycle to third stage 318 through clock signal path $317_N$. Once the Nth clock cycle is reached, second stage $312_1$ passes the N+1 clock cycle and the processed data aligned with the N+1 clock cycle to third stage 318 and the process repeats.

Third stage 318 merges the data signal and the clock signal from each of the plurality of second stages $312_1$ to $312_N$ to provide a merged data signal and a return clock signal. Third stage 318 may process data in response to the clock signal at the first data rate, which as previously described is equal to the clock rate of the clock signal. The delay of data through data path 320 may be substantially equal to (e.g., equal to) the delay of the clock signal through clock path 322 of third stage 318. Data path 320 of third stage 318 merges the processed data from each second stage $312_1$ to $312_N$ to provide merged data on data signal path 324. Clock path 322 of third stage 318 merges the clock cycles from each second stage $312_1$ to $312_N$ to provide a return clock signal on return clock signal path 326. According, the merged data on data signal path 324 is aligned with the return clock signal on return clock signal path 326.

The merged data on data signal path 324 is latched into data latch 328 in response to the return clock signal on return clock signal path 326. The data is output to data node 330 from data latch 328 in response to a clock signal from clock node 332. Accordingly, wave pipeline 300 includes an N-way wave architecture (i.e., via the group of second stages $312_1$ to $312_N$) where the clock signal and the data signal are sent to one of the ways every Nth clock cycle. The results are then merged together to generate the merged data signal and the return clock signal. By using an N-way wave architecture for a stage in a wave pipeline, the data rate of each way of that stage may be reduced by N times the data rate of the wave pipeline as a whole. As a result, a slow stage in the wave pipeline may not limit the maximum transfer rate to and from that stage.

FIG. 4 is a schematic diagram illustrating one embodiment of an output data path 400. In one example, output data path 400 is a portion of the memory device 100 previously described and illustrated with reference to FIG. 1. Output data path 400 may include a read enable RE# clock signal node (e.g., pad) 402, a clock generator 406, an address counter 416, a clock demultiplexer 414, an address demultiplexer 424, a first sensing device $430_1$, a second sensing device $430_2$, a data multiplexer 440, a clock multiplexer 448, buffers 410, 420, 444, and 452, a FIFO 456, and data node(s) (e.g., pad(s)) DQ(s) 460. Each sensing device $430_1$ and $430_2$ includes a data path including a sense amplifier $432_1$ and $432_2$ and a clock path $434_1$ and $434_2$, respectively. First sensing device $430_1$ and second sensing device $430_2$ provide a two-way sensing stage.

RE# clock signal pad 402 is electrically coupled to an input of clock generator 406 through a signal path 404. An output of clock generator 406 is electrically coupled to the exit clock input (EXT) of FIFO 456, the input of buffer 410, and the input of address counter 416 through a clock signal path 408. The output of buffer 410 is electrically coupled to the input of clock demultiplexer 414 through a clock signal path 412. An output of address counter 416 is communicatively coupled to the input of buffer 420 through an address signal path 418. The output of buffer 420 is communicatively coupled to the input of address demultiplexer 424 through an address signal path 422. A first output of clock demultiplexer 414 is electrically coupled to the input of clock path $434_1$ of first sensing device $430_1$ through a clock signal path $428_1$. A second output of clock demultiplexer 414 is electrically coupled to the input of clock path $434_2$ of second sensing device $430_2$ through a clock signal path $428_2$. A first output of address demultiplexer 424 is communicatively coupled to the input of sense amplifier $432_1$ of first sensing device $430_1$ through an address signal path $426_1$. A second output of address demultiplexer 424 is communicatively coupled to the input of sense amplifier $432_2$ of second sensing device $430_2$ through an address signal path $426_2$.

The output of sense amplifier $432_1$ of first sensing device $430_1$ is communicatively coupled to a first input of data multiplexer 440 through a data path $436_1$. The output of sense amplifier $432_2$ of second sensing device $430_2$ is communicatively coupled to a second input of data multiplexer 440 through a data path $436_2$. The output of clock path $434_1$ of first sensing device $430_1$ is electrically coupled to a first input of clock multiplexer 448 through a clock signal path $438_1$. The output of clock path $434_2$ of second sensing device $430_2$ is electrically coupled to a second input of clock multiplexer 448 through a clock signal path $438_2$. The output of data multiplexer 440 is communicatively coupled to the input of buffer 444 through a data path 442. The output of buffer 444 is communicatively coupled to the data input of FIFO 456 through a data path 446. The output of clock multiplexer 448 is electrically coupled to the input of buffer 452 through a return clock signal path 450. The output of buffer 452 is electrically coupled to the entrance clock input (ENT) of FIFO 456 through a return clock signal path 454. The data output of FIFO 456 is communicatively coupled to DQ(s) 460 through a data path 458. The data width of FIFO 456 may equal the data width of data path 446. FIFO 456 may have any suitable number of stages based on the particular configuration of the memory device.

In one example, DQ(s) 460 is a single data pad, and data paths $436_1$, $436_2$, 442, 446, and 458 are corresponding single bit data paths. In other examples, DQ(s) 460 are multiple data pads (e.g., eight data pads, sixteen data pads), and data paths $436_1$, $436_2$, 442, 446, and 458 are multiple bit parallel data paths. A serializer (not shown) may be included on data path 458 between FIFO 456 and each DQ 460 to serialize parallel data from FIFO 456 for output on DQ(s) 460. In this case, the data width of FIFO 456 and data paths $436_1$, $436_2$, 442, and 446 may be a multiple of the number of DQ(s) 460. For example, for four DQs 460 and an eight bit serializer for each DQ 460, the data width of FIFO 456 and data paths $436_1$, $436_2$, 442, and 446 is 32 bits for a double data rate (DDR) memory.

Clock generator 406 receives the RE# clock signal and generates a clock signal on clock signal path 408. In one example, clock generator 406 reduces the clock rate of the RE# clock signal so that the data throughput on data paths 442 and 446 may be equal to the number of DQs 460. For example, for eight DQs 460 and a data width of 8×8=64 bits, clock generator 406 divides the RE# clock signal by four to provide the clock signal on clock signal path 408. The internal data bus is clocked by a single edge per cycle of the divided-down clock while the serializers and DQs are clocked by both edges per RE# clock cycle. The reduced clock rate for the internal data bus may be used to relax the internal timing requirements. The more reduced the internal clock rate, however, the wider the internal data bus generally needs to be to maintain the data throughput. Since a wider data bus may add layout cost and design complexity, however, there is a tradeoff between the data bus width and the internal clock rate.

Buffer 410 may delay the clock signal on clock signal path 408 to provide the clock signal (CLK) on clock signal path 412. Address counter 416 generates an address signal for first sensing device $430_1$ and second sensing device $430_2$ in response to the clock signal on clock signal path 408. Address counter 416 provides the address signal on signal path 418. Buffer 420 may delay the address signal on address signal path 418 to provide the address signal (ADDRESS) on address signal path 422. The clock signal on clock signal path 412 may be routed along with the address signal on address signal path 422 such that both the clock signal and the address signal are subjected to substantially the same delay due to the routing and PVT variations. The delay of buffers 410 and 420 may be adjusted to improve the alignment of the clock signal with the address signal.

Clock demultiplexer 414 divides the clock signal on clock signal path 412 between first sensing device $430_1$ and second sensing device $430_2$. Clock demultiplexer 414 provides a first clock cycle to first sensing device $430_1$ through clock signal path $428_1$ and a second clock cycle following (e.g., immediately following) the first clock cycle to second sensing device $430_2$ through clock signal path $428_2$. Clock demultiplexer 414 continues to repeat the process by providing a third clock cycle following (e.g., immediately following) the second clock cycle to first sensing device $430_1$ through clock signal path $428_1$ and a fourth clock cycle following (e.g., immediately following) the third clock cycle to second sensing device $430_2$ through clock signal path $428_2$, etc.

Address demultiplexer 424 receives the address signal on address signal path 422 to select either first sensing device $430_1$ or second sensing device $430_2$ in response to the address signal. Address demultiplexer 424 provides a first address to first sensing device $430_1$ through address signal path $426_1$ aligned with the first clock cycle to select first sensing device $430_1$ and a second address to second sensing device $430_2$ through address signal path $426_2$ aligned with the second clock cycle to select second sensing device $430_2$. Address demultiplexer 424 continues to repeat the process by providing the first address to first sensing device $430_1$ through address signal path $426_1$ aligned with the third clock cycle to select first sensing device $430_1$ and the second address to second sensing device $430_2$ through address signal path 426₂ aligned with the fourth clock cycle to select second sensing device 430₂, etc.

First sensing device 430₁ senses first data via sense amplifier 432₁ from an array of memory cells (e.g., memory array 104 of FIG. 1) in response to the first address on address signal path 426₁ and the first clock cycle on clock signal path 428₁. First sensing device 430₁ outputs the first data on data path 436₁ aligned with the first clock cycle on clock signal path 438₁. Likewise, second sensing device 430₂ senses second data via sense amplifier 432₂ from the array of memory cells in response to the second address on address signal path 426₂ and the second clock cycle on clock signal path 428₂. Second sensing device 430₂ outputs the second data on data path 436₂ aligned with the second clock cycle on clock signal path 438₂.

Data multiplexer 440 merges the first data on data path 436₁ from first sensing device 430₁ and the second data on data path 436₂ from second sensing device 430₂ onto data path 442. Clock multiplexer 448 merges the first clock cycle on clock signal path 438₁ from first sensing device 430₁ and the second clock cycle on clock signal path 438₂ from second sensing device 430₂ onto return clock signal path 450 to provide a return clock signal aligned with the data on the data path 442. The data on data path 442 is delayed by buffer 444 to provide the data on data path 446. The return clock signal on return clock signal path 450 is delayed by buffer 452 to provide a return clock signal on return clock signal path 454. The data on data paths 442 and 446 may be routed along with the return clock signal on return clock signal paths 450 and 454 such that the return clock signal and the data may be subjected to substantially the same delay due to the PVT variations. The delay of buffers 444 and 452 may be adjusted to improve the alignment of the return clock signal with the data. The return clock signal at the ENT input of FIFO 456 triggers the latching of the data at the input of FIFO 456 into FIFO 456. The clock signal on clock signal path 408 clocks data out of FIFO 456 to DQ(s) 460.

FIG. 5 is a timing diagram 470 illustrating one embodiment of the data and clock signals of output data path 400 described with reference to FIG. 4. Timing diagram 470 includes the clock signal (CLK) on clock signal path 412, the data from sense amplifier 432₁ (SA 1 OUT) on data path 436₁, the data from sense amplifier 432₂ (SA 2 OUT) on data path 436₂, the return clock signal (CLK_RTN) on return clock signal path 450, and the merged data on data path 442. A first clock cycle at 472 is passed to first sensing device 430₁. In response, sense amplifier 432₁ outputs first data (DATA 0) at 474 on data path 436₁ within two clock cycles of the clock signal. The first data is then passed to data path 442 and the first clock cycle is passed to return clock signal path 450 to provide the first data at 478 of the merged data aligned with the first clock cycle at 476 of the return clock signal. A second clock cycle at 480 is passed to second sensing device 430₂. In response, sense amplifier 432₂ outputs second data (DATA 1) at 482 on data path 436₂ within two clock cycles of the clock signal. The second data is then passed to data path 442 and the second clock cycle is passed to return clock signal path 450 to provide the second data at 486 of the merged data aligned with the second clock cycle at 484 of the return clock signal. The process is then repeated such that a third clock cycle at 488 is passed to first sensing device 430₁. In response, first sense amplifier 432₁ outputs third data (DATA 2) at 490 on data path 436₁ within two clock cycles of the clock signal. The third data is then passed to data path 442 and the third clock cycle is passed to return clock signal path 450 to provide the third data at 494 of the merged data aligned with the third clock cycle at 492 of the return clock signal, etc.

By using the two-way architecture for a sensing stage as described with reference to FIGS. 4 and 5, the data rate of each sensing device of the sensing stage can be halved without affecting the transmission speed to and from the stage. In this example, the clock cycle time is 10 ns. Therefore, in this example, each way of the sensing stage has 20 ns to sense the data from the memory array. By using the two-way architecture, the bus width may be reduced from a 128 bit bus with a 20 ns cycle time to a 64 bit bus with a 10 ns cycle time.

Figure 6:
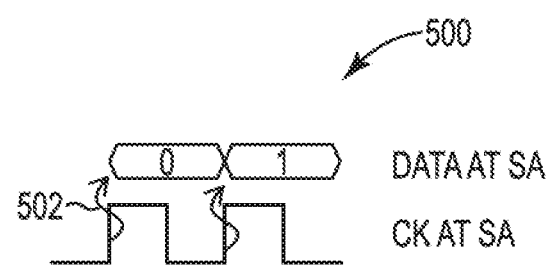
FIG. 6 is a timing diagram illustrating one embodiment of the triggering of data out of a sense amplifier of the output data path described with reference to FIG. 4.

FIG. 6 is a timing diagram 500 illustrating one embodiment of the triggering of data out of a sense amplifier of the output data path 400 described with reference to FIG. 4. Timing diagram 500 illustrates the data at a sense amplifier, such as sense amplifier 432₁ or 432₂, and the clock signal at the sense amplifier. As indicated at 502, the rising edge of the clock signal may trigger the data out of the sense amplifier to provide the data on data paths 436₁ or 436₂, respectively. The clock signal at each sense amplifier for the two-way architecture may include every other clock cycle of the clock signal.

Figure 7:
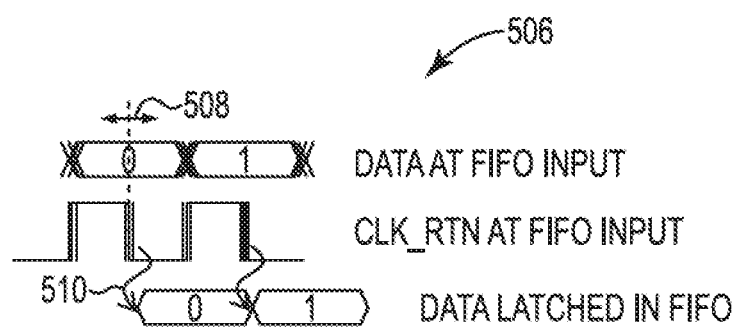
FIG. 7 is a timing diagram illustrating one embodiment of the latching of data into the first in first out (FIFO) of the output data path described with reference to FIG. 4.

FIG. 7 is a timing diagram 506 illustrating one embodiment of the latching of data into FIFO 456 of the output data path 400 described with reference to FIG. 4. Timing diagram 506 illustrates the data at the input of FIFO 456, the return clock signal at the ENT input of FIFO 456, and the data latched in FIFO 456. The setup and hold time margin for the data at the data input of FIFO 456 is indicated at 508. As indicated at 510, the falling edge of the return clock signal may latch the data into FIFO 456. By using the falling edge of the return clock signal to latch the data into FIFO 456, the maximum setup and hold time indicated at 508 may be inherently provided since the falling edge of the return clock signal may be automatically located at the center of the data eye opening. Thus, any timing window loss at the FIFO input due to the variation of the rising edge shift delay may be mitigated or eliminated.

Figure 8:
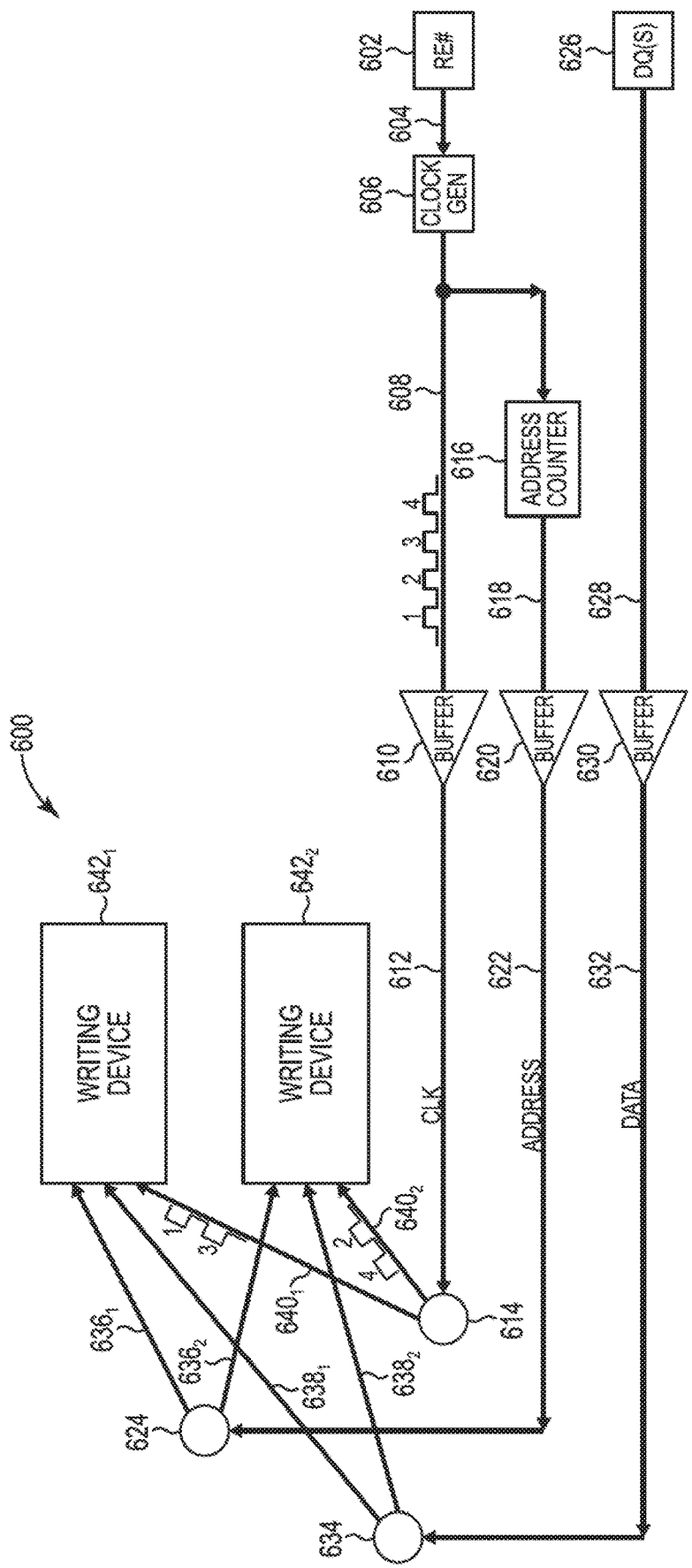
FIG. 8 is a schematic diagram illustrating one embodiment of an input data path.

FIG. 8 is a schematic diagram illustrating one embodiment of an input data path 600. In one example, input data path 600 is a portion of the memory device 100 previously described and illustrated with reference to FIG. 1. Input data path 600 may include a read enable RE# clock signal node (e.g., pad) 602, a clock generator 606, an address counter 616, data node(s) (e.g., pad(s)) DQ(s) 626, buffers 610, 620, and 630, a clock demultiplexer 614, an address demultiplexer 624, a data demultiplexer 634, a first writing device 642₁ (e.g., a first sense amplifier), and a second writing device 642₂ (e.g., a second sense amplifier). First writing device 642₁ and second writing device 642₂ provide a two-way writing stage.

RE# clock signal pad 602 is electrically coupled to an input of clock generator 606 through a signal path 604. An output of clock generator 606 is electrically coupled to the input of buffer 610 and the input of address counter 616 through a clock signal path 608. The output of buffer 610 is electrically coupled to the input of clock demultiplexer 614 through a clock signal path 612. An output of address counter 616 is communicatively coupled to the input of buffer 620 through an address signal path 618. The output of buffer 620 is communicatively coupled to the input of address demultiplexer 624 through an address signal path 622. DQ(s) 626 are communicatively coupled to the input of buffer 630 through a data path 628. The output of buffer 630 is communicatively coupled to the input of data demultiplexer 634 through a data path 632.

A first output of clock demultiplexer 614 is electrically coupled to the clock input of first writing device $642_1$ through a clock signal path $640_1$. A second output of clock demultiplexer 614 is electrically coupled to the clock input of second writing device $642_2$ through a clock signal path $640_2$. A first output of address demultiplexer 624 is communicatively coupled to the address input of first writing device $642_1$ through an address signal path $636_1$. A second output of address demultiplexer 624 is communicatively coupled to the address input of second writing device $642_2$ through an address signal path $636_2$. A first output of data demultiplexer 634 is communicatively coupled to the data input of first writing device $642_1$ through a data path $638_1$. A second output of data demultiplexer 634 is communicatively coupled to the data input of second writing device $642_2$ through a data path $638_2$.

Clock generator 606 receives the RE# clock signal and generates a clock signal on clock signal path 608. Buffer 610 may delay the clock signal on clock signal path 608 to provide the clock signal (CLK) on clock signal path 612. Address counter 616 generates an address signal for first writing device $642_1$ and second writing device $642_2$ in response to the clock signal on clock signal path 608. Address counter 616 provides the address signal on address signal path 618. Buffer 620 may delay the address signal on address signal path 618 to provide the address signal (ADDRESS) on address signal path 622. DQ(s) 626 receive data and pass the data to buffer 630 through data path 628. Buffer 630 may delay the data on data path 628 to provide the data (DATA) on data path 632. The clock signal on clock signal path 612 may be routed along with the address signal on address signal path 622 and the data on data path 632 such that the clock signal, the address signal, and the data may be subjected to substantially the same delay due to the PVT variations. The delay of buffers 610, 620, and 630 may be adjusted to improve the alignment of the clock signal with the address signal and the data.

Clock demultiplexer 614 divides the clock signal on clock signal path 612 between first writing device $642_1$ and second writing device $642_2$. Clock demultiplexer 614 provides a first clock cycle to first writing device $642_1$ through clock signal path $640_1$ and a second clock cycle following (e.g., immediately following) the first clock cycle to second writing device $642_2$ through clock signal path $640_2$. Clock demultiplexer 614 continues to repeat the process by providing a third clock cycle following (e.g., immediately following) the second clock cycle to first writing device $642_1$ through clock signal path $640_1$ and a fourth clock cycle following (e.g., immediately following) the third clock cycle to second writing device $642_2$ through clock signal path $640_2$, etc.

Address demultiplexer 624 receives the address signal on address signal path 622 to select either first writing device $642_1$ or second writing device $642_2$ in response to the address signal. Address demultiplexer 624 provides a first address to first writing device $642_1$ through address signal path $636_1$ aligned with the first clock cycle to select first writing device $642_1$ and a second address to second writing device $642_2$ through address signal path $636_2$ aligned with the second clock cycle to select second writing device $642_2$. Address demultiplexer 624 may continue to repeat the process by providing the first address to first writing device $642_1$ through address signal path $636_1$ aligned with the third clock cycle to select first writing device $642_1$ and the second address to second writing device $642_2$ through address signal path $636_2$ aligned with the fourth clock cycle to select second writing device $642_2$, etc.

Data demultiplexer 634 divides the data signal on data path 632 between first writing device $642_1$ and second writing device $642_2$. Data demultiplexer 634 provides first data to first writing device $642_1$ through data path $638_1$ aligned with the first clock cycle and the first address and second data to second writing device $642_2$ through data path $638_2$ aligned with the second clock cycle and the second address. Data demultiplexer 634 may continue to repeat the process by providing third data to first writing device $642_1$ through data path $638_1$ aligned with the third clock cycle and the first address and fourth data to second writing device $642_2$ through data path $638_2$ aligned with the fourth clock cycle and the second address, etc.

First writing device $642_1$ writes the first data to an array of memory cells (e.g., memory array 104 of FIG. 1) in response to the first address on address signal path $636_1$ and the first clock cycle on clock signal path $640_1$. Likewise, second writing device $642_2$ writes the second data to the array of memory cells in response to the second address on address signal path $636_2$ and the second clock cycle on clock signal path $640_2$. By using the two-way architecture for a writing stage as illustrated in FIG. 8, the data rate of the writing stage can be halved without affecting the transmission speed to the stage.

Figure 9:
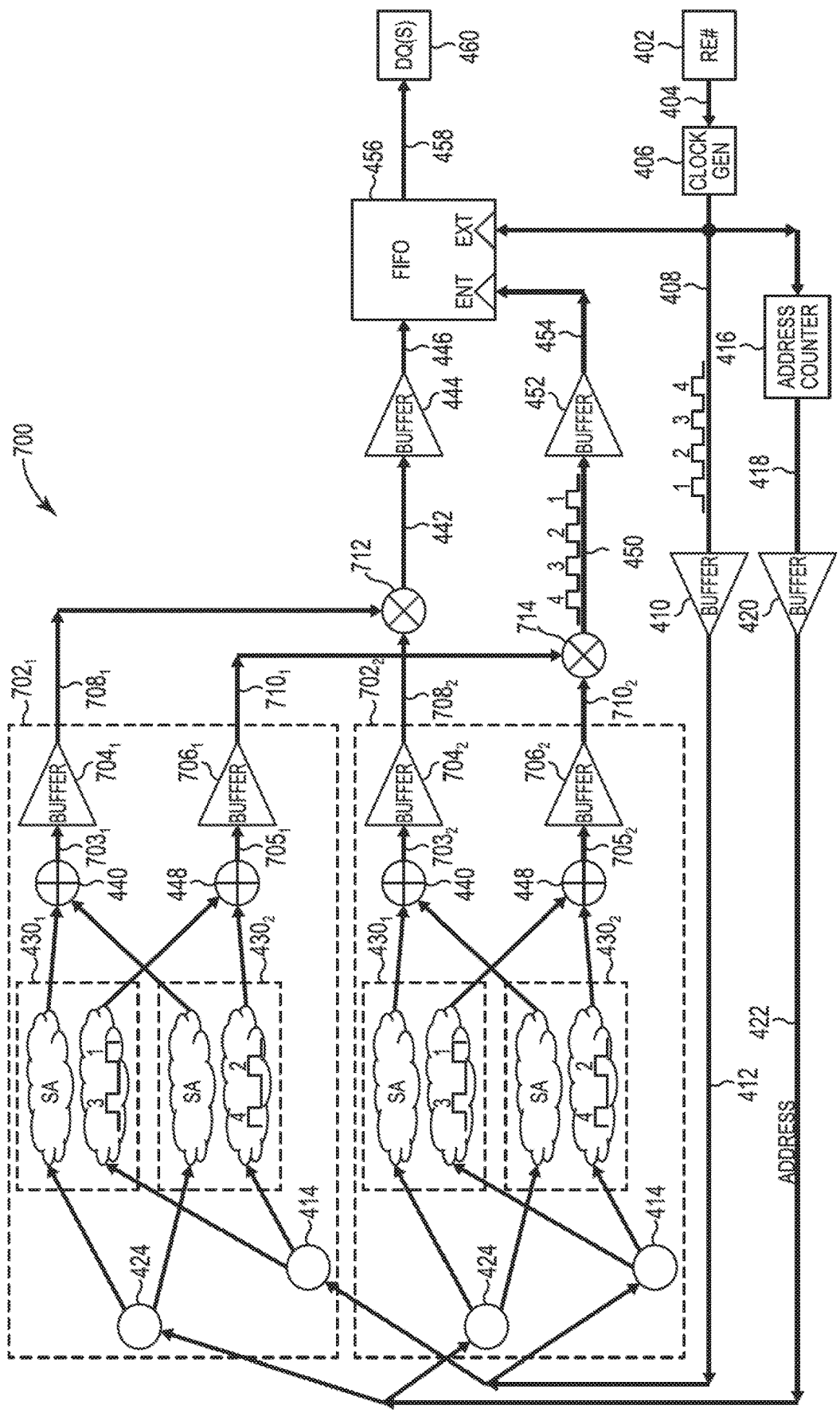
FIG. 9 is a schematic diagram illustrating another embodiment of an output data path.

FIG. 9 is a schematic diagram illustrating another embodiment of an output data path 700. Output data path 700 is similar to output data path 400 previously described and illustrated with reference to FIG. 4, except that output data path 700 includes two groups $702_1$ and $702_2$ of sensing stages in place of the single group of sensing stages of output data path 400. While output data path 700 includes two groups $702_1$ and $702_2$, in other examples output data path 700 may include any suitable number of groups. Output data path 700 may include a read enable RE# clock signal node (e.g., pad) 402, a clock generator 406, an address counter 416, buffers 410, 420, 444, and 452, a FIFO 456, and data node(s) (e.g., pad(s)) DQ(s) 460 as previously described and illustrated with reference to FIG. 4. In addition, each group $702_1$ and $702_2$ includes a clock demultiplexer 414, an address demultiplexer 424, a first sensing device $430_1$, a second sensing device $430_2$, a data multiplexer 440, and a clock multiplexer 448 as previously described and illustrated with reference to FIG. 4. Group $702_1$ also includes buffers $704_1$ and $706_1$ and group $702_2$ also includes buffers $704_2$ and $706_2$. Output data path 700 also includes a data multiplexer 712 and a clock multiplexer 714.

Clock signal path 412 is electrically coupled to the input of clock demultiplexer 414 of both groups $702_1$ and $702_2$. Address signal path 422 is communicatively coupled to the input of address demultiplexer 424 of both groups $702_1$ and $702_2$. The output of data multiplexer 440 of group $702_1$ is communicatively coupled to the input of buffer $704_1$ through a data path $703_1$. The output of buffer $704_1$ is communicatively coupled to a first input of data multiplexer 712 through a data path $708_1$. The output of clock multiplexer 448 of group $702_1$ is electrically coupled to the input of buffer $706_1$ through a clock signal path $705_1$. The output of buffer $706_1$ is electrically coupled to a first input of clock multiplexer 714 through a clock signal path $710_1$. The output of data multiplexer 440 of group $702_2$ is communicatively coupled to the input of buffer $704_2$ through a data path $703_2$. The output of buffer $704_2$ is communicatively coupled to a second input of data multiplexer 712 through a data path $708_2$. The output of clock multiplexer 448 of group $702_2$ is electrically coupled to the input of buffer $706_2$ through a clock signal path $705_2$. The output of buffer $706_2$ is electrically coupled to a second input of clock multiplexer 714 through a clock signal path $710_2$. The output of data multiplexer 712 is communicatively coupled to data path 442, and the output of clock multiplexer 714 is communicatively coupled to return clock signal path 450.

In this example, one of groups $702_1$ and $702_2$ is active while the other of groups $702_1$ and $702_2$ is inactive. Each group $702_1$ and $702_2$ may operate similarly to the single group previously described and illustrated with reference to FIG. 4 except that the address signal on address signal path 422 may also select which group is active.

Data multiplexer 712 merges the data on data path $708_1$ from group $702_1$ and the data on data path $708_2$ from group $702_2$ onto data path 442. Clock multiplexer 714 merges the clock signal on clock signal path $710_1$ from group $702_1$ and the clock signal on clock signal path $710_2$ from group $702_2$ onto return clock signal path 450 to provide the return clock signal aligned with the data on the data path 442.

Figure 10:
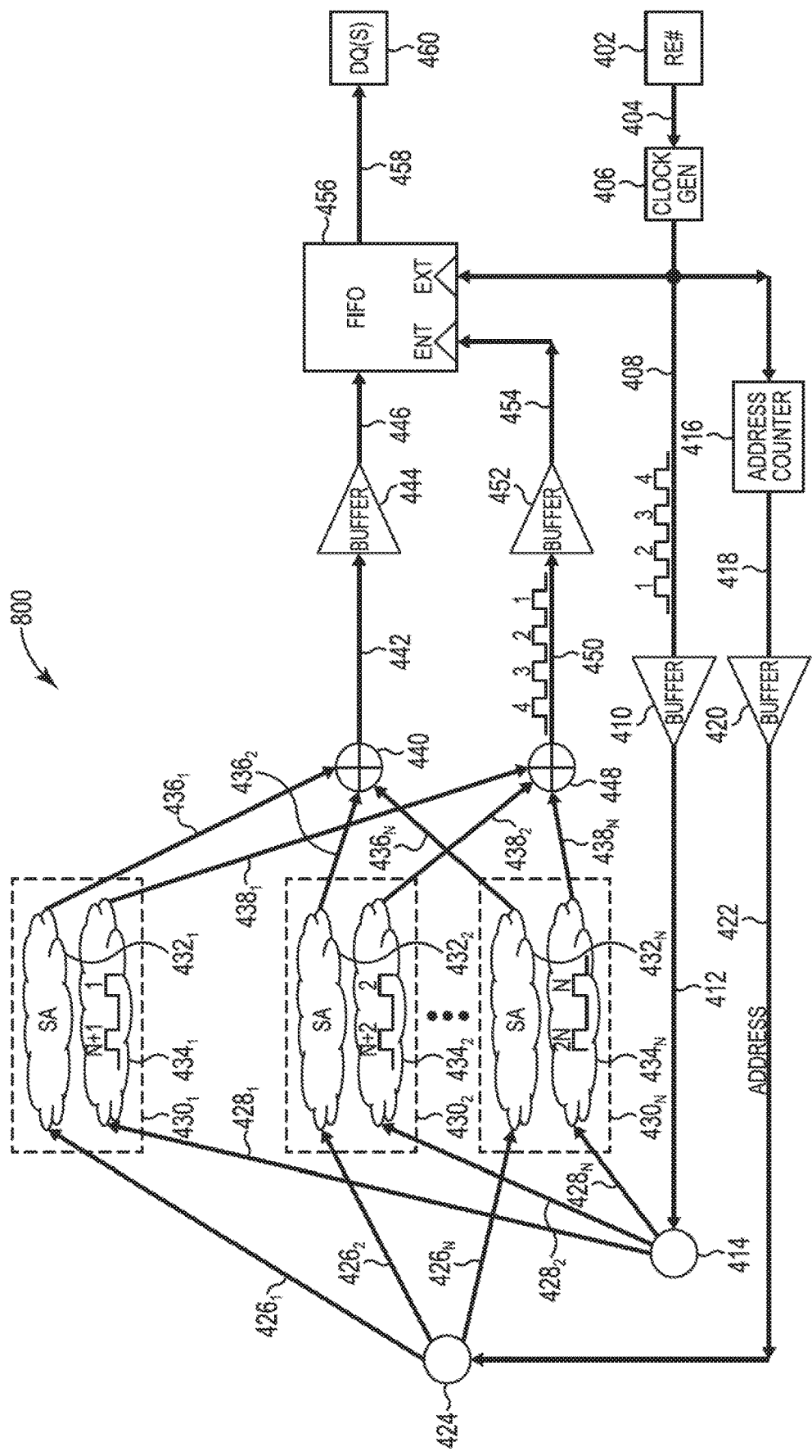
FIG. 10 is a schematic diagram illustrating another embodiment of an output data path.

FIG. 10 is a schematic diagram illustrating another embodiment of an output data path 800. Output data path 800 is similar to output data path 400 previously described and illustrated with reference to FIG. 4, except that output data path 800 includes sensing devices $430_1$ to $430_N$, where "N" is any suitable number of sensing stages. In this example, each output of clock demultiplexer 414 is electrically coupled to the input of a clock path $434_1$ to $434_N$ through a clock signal path $428_1$ to $428_N$, respectively. Each output of address demultiplexer 424 is communicatively coupled to the input of a sense amplifier $432_1$ to $432_N$ through an address signal path $426_1$ to $426_N$, respectively. The output of each sense amplifier $432_1$ to $432_N$ is communicatively coupled to an input of data multiplexer 440 through a data path $436_1$ to $436_N$, respectively. The output of each clock path $434_1$ to $434_N$ of sensing devices $430_1$ to $430_N$ is electrically coupled to an input of clock multiplexer 448 through a clock signal path $438_1$ to $438_N$, respectively.

In the N-way architecture illustrated in FIG. 10, each sensing device $430_1$ to $430_N$ receives a clock cycle and an address aligned with the clock cycle for selecting the sensing device every Nth clock cycle. By using the N-way architecture for a sensing stage, the data rate of each sensing device $430_1$ to $430_N$ of the sensing stage can be reduced by N times the clock rate without affecting the transmission speed to and from the stage. For example, for a clock rate of 10 ns and where N equals five, each sensing device $430_1$ to $430_N$ has 50 ns to sense the data from the memory array.

Figure 11:
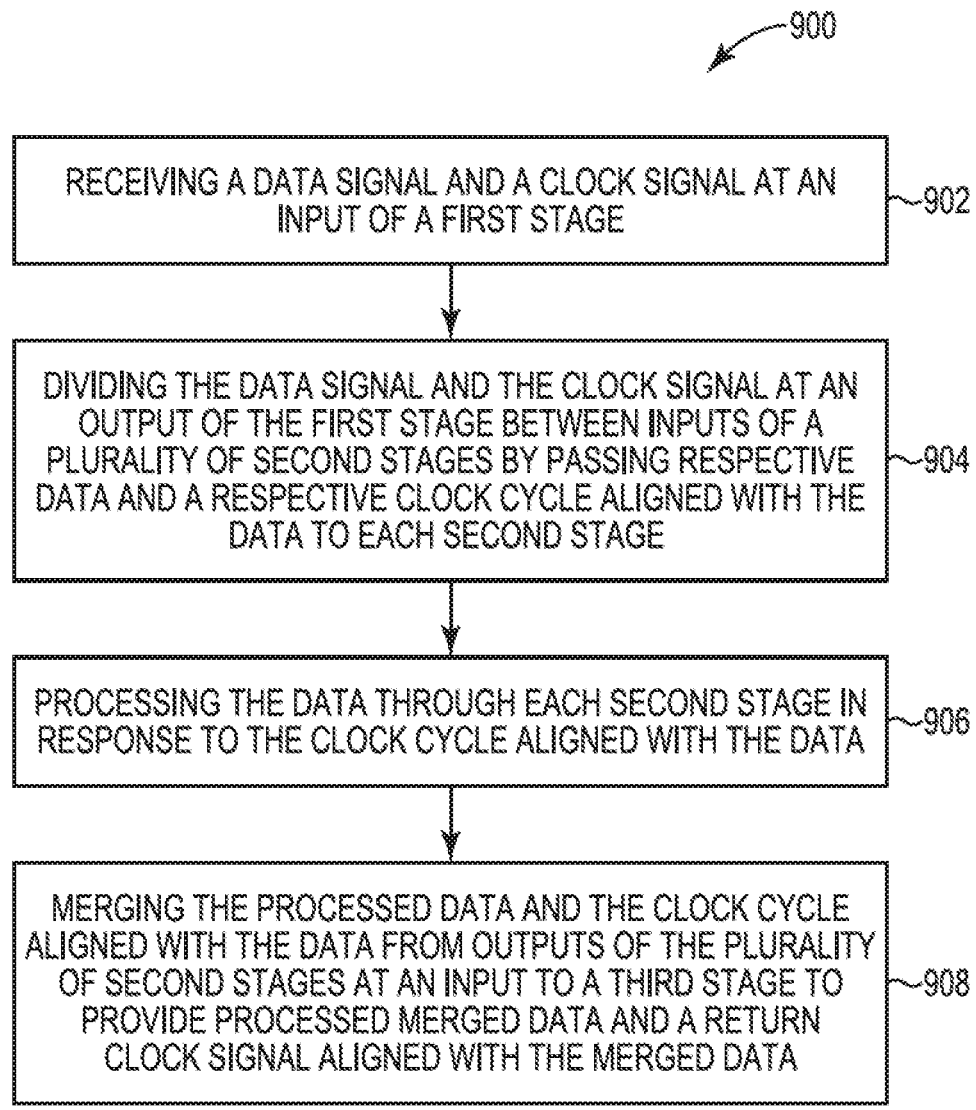
FIG. 11 is a flow diagram illustrating one embodiment of a method for processing data through a wave pipeline.

FIG. 11 is a flow diagram illustrating one embodiment of a method 900 for processing data through a wave pipeline. At 902, method 900 includes receiving a data signal and a clock signal at an input of a first stage. At 904, method 900 includes dividing the data signal and the clock signal at an output of the first stage between inputs of a plurality of second stages by passing respective data and a respective clock cycle aligned with the data to each second stage. At 906, method 900 includes processing the data through each second stage in response to the clock cycle aligned with the data. In one example, processing the data through each second stage includes processing the data through each second stage within a number of clock cycles of the clock signal equal to the number of second stages. At 908, method 900 includes merging the processed data and the clock cycle aligned with the data from outputs of the plurality of second stages at an input to a third stage to provide processed merged data and a return clock signal aligned with the merged data. Method 900 may also include latching the processed merged data in a data latch in response to the return clock signal. In addition, method 900 may include delaying the clock cycle within each second stage a number of clock cycles of the clock signal equal to the number of second stages.

Figure 12:
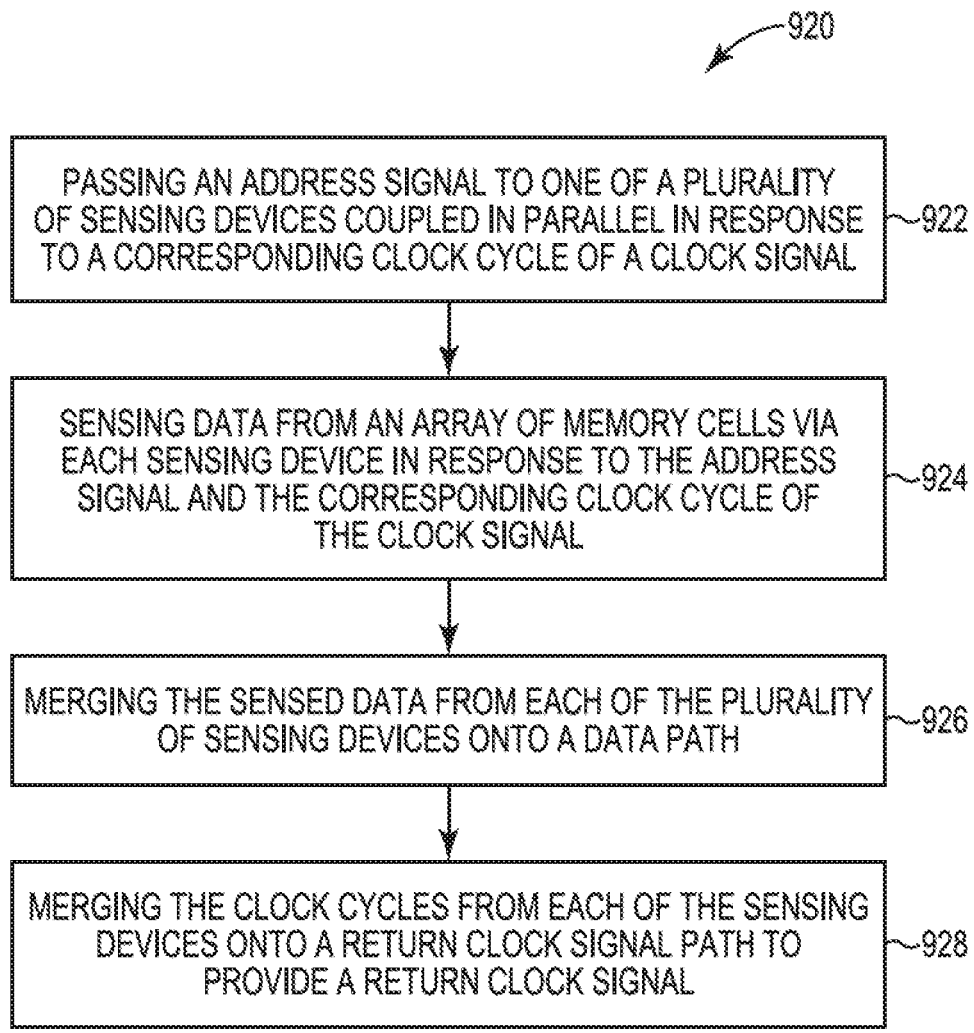
FIG. 12 is a flow diagram illustrating one embodiment of a method for reading data from an array of memory cells.

FIG. 12 is a flow diagram illustrating one embodiment of a method 920 for reading data from an array of memory cells. At 922, method 920 includes passing an address signal to one of a plurality of sensing devices coupled in parallel in response to a corresponding clock cycle of a clock signal, e.g., in response to a rising or falling edge of the corresponding clock cycle of the clock signal. In one example, the address signal is generated in response to the clock signal. At 924, method 920 includes sensing data from an array of memory cells via each sensing device in response to the address signal and the corresponding clock cycle of the clock signal. In one example, each of the plurality of sensing devices senses data from the array of memory cells within a number of clock cycles of the clock signal equal to the number of sensing devices. At 926, method 920 includes merging the sensed data from each of the plurality of sensing devices onto a data path. At 928, method 920 includes merging the clock cycles from each of the sensing devices onto a return clock signal path to provide a return clock signal. Method 920 may also include triggering a data latch to latch the data on the data path into the data latch in response to the return clock signal on the return clock signal path. In addition, method 920 may include triggering the data latch to output data to a data node in response to the clock signal.

Figure 13:
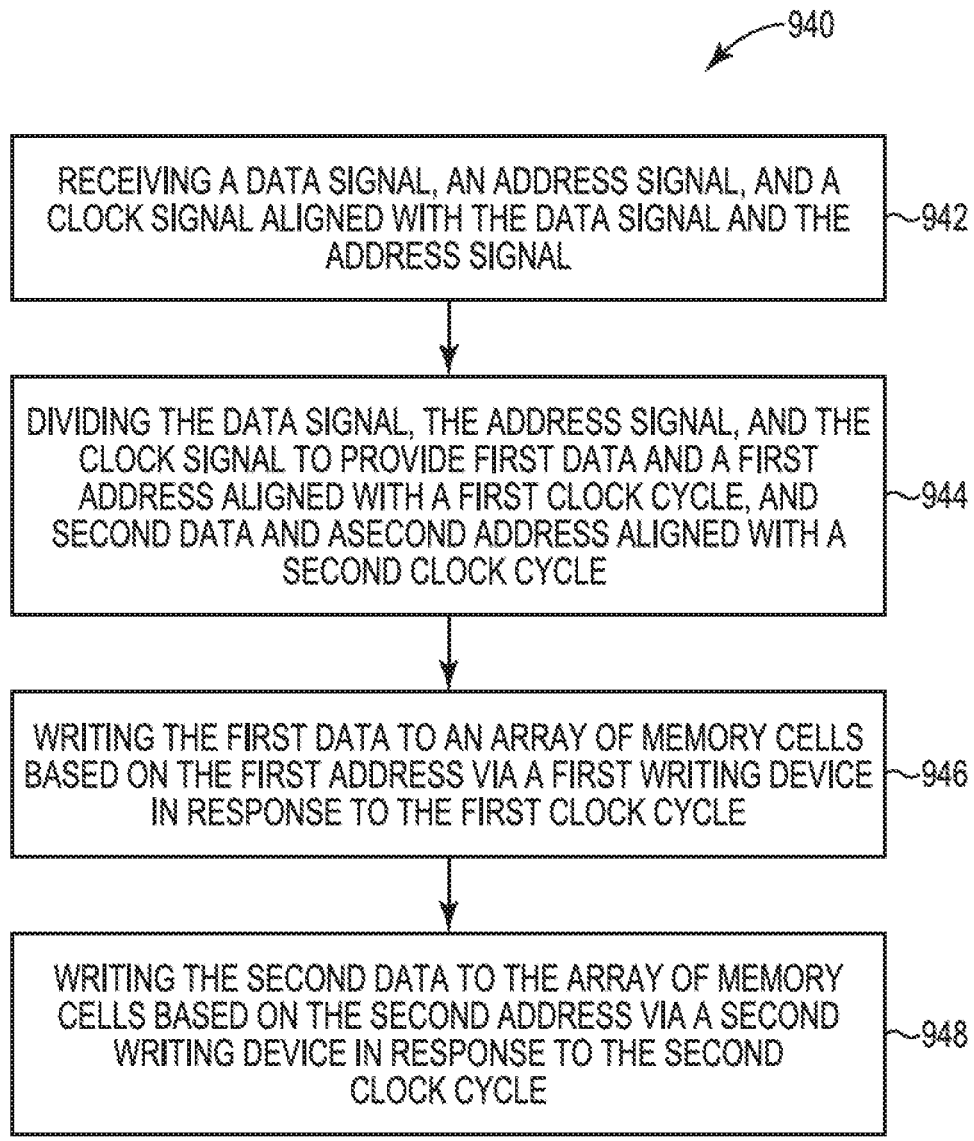
FIG. 13 is a flow diagram illustrating one embodiment of a method for writing data to an array of memory cells.

FIG. 13 is a flow diagram illustrating one embodiment of a method 940 for writing data to an array of memory cells. At 942, method 940 includes receiving a data signal, an address signal, and a clock signal aligned with the data signal and the address signal. In one example, the clock signal is generated based on a read enable signal. The address signal may be generated in response to the clock signal. At 944, method 940 includes dividing the data signal, the address signal, and the clock signal to provide first data and a first address aligned with a first clock cycle, and second data and a second address aligned with a second clock cycle. At 946, method 940 includes writing the first data to an array of memory cells based on the first address via a first writing device in response to the first clock cycle. At 948, method 940 includes writing the second data to the array of memory cells based on the second address via a second writing device in response to the second clock cycle. In one example, writing the first data exceeds one clock cycle of the clock signal and writing the second data exceeds one clock cycle of the clock signal.

Method 940 may also include passing the first data to the first writing device via a first data path, passing the first address to the first writing device via a first address path, and passing the first clock cycle to the first writing device via a first clock path. In addition, method 940 may include passing the second data to the second writing device via a second data path, passing the second address to the second writing device via a second address path, and passing the second clock cycle to the second writing device via a second clock path.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art.

Accordingly, this application is intended to cover any adaptations or variations of the embodiments.

What is claimed is:

1. A system comprising:
    a first sensing device to sense first data from an array of memory cells in response to a first clock cycle of a clock signal, the sensing of the first data exceeding one clock cycle of the clock signal;
    a second sensing device to sense second data from the array of memory cells in response to a second clock cycle of the clock signal, the second clock cycle following the first clock cycle and the sensing of the second data exceeding one clock cycle of the clock signal; and
    a data multiplexer to merge the first data from the first sensing device and the second data from the second sensing device onto a data path,
    wherein the data multiplexer merges the first data and the second data at a first data rate equal to a clock rate of the clock signal,
    wherein the first sensing device senses the first data at a second data rate equal to the first data rate times two, and
    wherein the second sensing device senses the second data at the second data rate.

2. The system of claim 1, wherein the first sensing device senses the first data within two clock cycles of the clock signal, and
    wherein the second sensing device senses the second data within two clock cycles of the clock signal.

3. The system of claim 1, further comprising:
    an address demultiplexer to receive an address signal and pass a first address to the first sensing device aligned with the first clock cycle and pass a second address to the second sensing device aligned with the second clock cycle.

4. The system of claim 3, further comprising:
    an address counter to receive the clock signal and provide the address signal in response to the clock signal.

5. The system of claim 1, further comprising:
    a clock demultiplexer to receive the clock signal and pass the first clock cycle to the first sensing device and pass the second clock cycle to the second sensing device; and
    a clock multiplexer to merge the first clock cycle from the first sensing device and the second clock cycle from the second sensing device onto a return clock signal path to provide a return clock signal aligned with the data on the data path.

6. The system of claim 5, further comprising:
    a data latch to latch the data on the data path into the data latch in response to the return clock signal on the return clock signal path.

7. The system of claim 6, wherein the data latch outputs data to a data node in response to the clock signal on the clock signal path.

8. The system of claim 1, further comprising:
    a clock generator to receive a read enable signal and to generate the clock signal based on the read enable signal.

9. The system of claim 1, wherein the second clock cycle immediately follows the first clock cycle.

10. A method comprising:
    passing an address signal to one of a plurality of sensing devices coupled in parallel in response to a corresponding clock cycle of a clock signal at a first data rate equal to a dock rate of the clock signal;
    sensing data from an array of memory cells via each sensing device in response to the address signal and the corresponding clock cycle of the clock signal at a second data rate equal to the first data rate times the number of sensing devices of the plurality of sensing devices;
    merging the sensed data from each of the plurality of sensing devices onto a data path at the first data rate; and
    merging the clock cycles from each of the sensing devices onto a return clock signal path at the first data rate to provide a return clock signal.

11. The method of claim 10, wherein each of the plurality of sensing devices senses data from the array of memory cells within a number of clock cycles of the clock signal equal to the number of sensing devices.

12. The method of claim 10, further comprising:
    triggering a data latch to latch the data on the data path into the data latch in response to the return clock signal on the return clock signal path.

13. The method of claim 12, further comprising:
    triggering the data latch to output data to a data node in response to the clock signal.

14. The method of claim 10, further comprising:
    generating the address signal in response to the clock signal.

15. A system comprising:
    an array of memory cells;
    a plurality of sensing devices coupled in parallel;
    a clock demultiplexer to receive a clock signal and pass a respective clock cycle of the clock signal to each sensing device of the plurality of sensing devices at a first data rate equal to a clock rate of the clock signal; and
    an address demultiplexer to receive an address signal and pass a respective address to each sensing device of the plurality of sensing devices at the first data rate,
    wherein each sensing device of the plurality of sensing devices is to sense respective data from the array of memory cells at a second data rate equal to the first data rate times the number of sensing devices of the plurality of sensing devices in response to a respective clock cycle received from the clock demultiplexer and a respective address received from the address demultiplexer.

16. The system of claim 15, further comprising:
    a data multiplexer to merge the respective sensed data from each sensing device of the plurality of sensing devices onto a data path; and
    a clock multiplexer to merge the respective clock cycle from each sensing device of the plurality of sensing devices onto a return clock signal path to provide a return clock signal aligned with the data on the data path.

17. The system of claim 16, further comprising:
    a data latch to latch the data on the data path into the data latch in response to the return clock signal.

18. The system of claim 17, wherein the data latch outputs data to a data node in response to the clock signal.

19. The system of claim 15, wherein the number of sensing devices of the plurality of sensing devices is greater than two.

20. The system of claim 15, further comprising:
    an address counter to receive the clock signal and provide the address signal in response to the clock signal.

21. The system of claim 15, further comprising:
a clock generator to receive a read enable signal and to generate the clock signal based on the read enable signal.

\* \* \* \* \*

UNITED STATES PATENT AND TRADEMARK OFFICE
CERTIFICATE OF CORRECTION

| | |
|---|---|
| PATENT NO. | : 10,891,993 B2 |
| APPLICATION NO. | : 16/429209 |
| DATED | : January 12, 2021 |
| INVENTOR(S) | : Shakeri et al. |

It is certified that error appears in the above-identified patent and that said Letters Patent is hereby corrected as shown below:

In the Claims

Column 17, Line 67, Claim 10, delete "to a dock rate" and insert in place thereof --to a clock rate--.

Signed and Sealed this
Twentieth Day of December, 2022

Katherine Kelly Vidal
*Director of the United States Patent and Trademark Office*